United States Patent
Kazmierowicz et al.

(10) Patent No.: US 6,283,379 B1
(45) Date of Patent: Sep. 4, 2001

(54) METHOD FOR CORRELATING PROCESSOR AND PART TEMPERATURES USING AN AIR TEMPERATURE SENSOR FOR A CONVEYORIZED THERMAL PROCESSOR

(75) Inventors: Philip C. Kazmierowicz, Estacada, OR (US); Steven Arthur Schultz, Gardena, CA (US)

(73) Assignee: KIC Thermal Profiling, San Diego, CA (US)

( * ) Notice: Subject to any disclaimer, the term of this patent is extended or adjusted under 35 U.S.C. 154(b) by 0 days.

(21) Appl. No.: 09/504,015

(22) Filed: Feb. 14, 2000

(51) Int. Cl.$^7$ .............................. G05B 21/00; F21B 9/06
(52) U.S. Cl. ................ 236/15 BC; 219/388; 236/78 D; 432/11; 700/274
(58) Field of Search ............................ 236/15 BC, 78 B, 236/78 D; 219/388; 392/417; 432/11, 51; 228/9; 700/274, 300

(56) References Cited

U.S. PATENT DOCUMENTS

| | | | |
|---|---|---|---|
| 3,447,745 | * 6/1969 | Perrine et al. | 236/15 BC |
| 3,621,213 | 11/1971 | Jen et al. | 235/150 |
| 3,793,717 | 2/1974 | Degenkolb et al. | 29/610 |
| 4,176,554 | 12/1979 | Kazmierowicz | 73/341 |
| 4,242,907 | 1/1981 | Kazmierowicz | 73/341 |
| 4,276,603 | * 6/1981 | Beck et al. | 236/78 B X |
| 4,501,552 | 2/1985 | Wakamiya | 432/49 |
| 4,605,161 | * 8/1986 | Motomiya et al. | 236/15 BC |
| 4,688,180 | 8/1987 | Motomiya | 364/477 |
| 4,775,542 | 10/1988 | Manser et al. | 364/555 |
| 4,982,347 | 1/1991 | Rackerby et al. | 364/557 |
| 6,168,064 | * 1/2001 | Berkin | 219/388 |

FOREIGN PATENT DOCUMENTS

| | | | |
|---|---|---|---|
| 2311616 | 9/1973 | (DE) | 364/477 |

OTHER PUBLICATIONS

Press et al, Numerical Recipies in Fortran 2/e, 1992 cambridge, pp. 402–409, 413–417, 1992.*

G. E. P. Box, et al., "On the Experimental Attainment of Optimum Conditions", *J. Royal Statistical Society*, series B, v. xiii, No. 1, 1951, pp. 1–5.

Jyh–Shing Roger Jang, *Neuro–fuzzy and Soft Computing*, ©1997 Prentice–Hall, pp. 156–193.

Germund Dahlquist, et al., *Numerical Methods*, ©1974 Prentice–Hall, pp. 438–441.

Berc Rustem, *Algorithms for Nonlinear Programming and Multiple–Objective Decisions*, ©1998 John Wiley, pp. 59–63, 267–269.

Donald A. Pierre, *Optimization Theory with Applications*, ©1969 Dover, pp. 296–319.

Ernest L. Hall, *Computer Image Processing and Recognition*, ©1979, Academic, pp. 202–205.

Joel H. Ferziger, *Numerical Methods for Engineering Applications* 2/e, ©1998, John Wiley, pp. 283–285.

Saunders Technology, Inc., "Profile Wizard™", 1999, 2 pages.

* cited by examiner

*Primary Examiner*—William Wayner
(74) *Attorney, Agent, or Firm*—Thelen Reid & Preist LLP; Gerhard W. Theilman

(57) ABSTRACT

A method for aligning a boundary condition temperature in a thermal processor utilizes an air temperature measurement. During the thermal process, air temperature measured along an interval series forms an air profile and provides a reference to which the boundary condition temperature may be aligned. A method for aligning a part temperature profile to the processor temperature profile uses the measured air temperature to adjust the part temperature profile, so as to be synchronized with the air temperature profile. These procedures may be used in conjunction with setpoint parameter prediction for attaining a target part temperature response.

27 Claims, 4 Drawing Sheets

METHOD FOR CORRELATING PROCESSOR AND PART TEMPERATURES USING AN AIR TEMPERATURE SENSOR FOR A CONVEYORIZED THERMAL PROCESSOR

FIELD OF THE INVENTION

The present invention relates to using an air temperature sensor to correlate processor temperature and part temperature in a multi-zone conveyorized thermal processor. Prediction algorithms for adjusting control parameters in the thermal processor may incorporate such a correlation between processor temperature, varying as distance along the thermal processor and part temperature, which varies with time.

BACKGROUND OF THE INVENTION

Thermal processing involves a series of procedures by which an item may be exposed to a temperature-controlled environment, and is used in a variety of manufacturing procedures such as heat treating, quenching and refrigerated storage. One example of a thermal processor is a reflow oven. The production of various goods such as electronic circuit boards in solder reflow ovens frequently entails carefully controlled exposure to heating and/or cooling for specific periods. The elevated temperature conditions needed to solder component leads onto printed circuit boards must be gradually and uniformly applied to minimize thermal expansion stresses.

For this reason, convection heat transfer may be employed in these solder "reflow" operations. The connecting solder paste incorporates an amalgam of substances that must undergo phase changes at separate temperature levels. Solder reflow may be performed by sequentially passing a part (such as a printed circuit board to become a processed product) through a series of thermally isolated adjacent regions or "zones" in the reflow oven, the temperature of each being independently controlled. The part may be placed on a conveyor, which moves the part into the reflow oven entrance, through the zones, and out of the oven through the exit. The exposure of the part to the reflow oven conditions can be called a thermal process.

The thermal process may be controlled by establishing a control setpoint temperature $T_c$ for each zone and a conveyor speed u at which the part passes through the reflow oven. Convection being an empirically characterized mode of heat transfer, the task of conforming a part's temperature response to a target profile by adjusting setpoint temperatures and conveyor speed has traditionally used methods that require detailed information on the reflow oven physical dimensions and conveyor speed. This has included total distance of the reflow oven, the distance from the entrance to the start and end of each zone, as well as the precise time a part has entered and exited the reflow oven.

The setpoint temperatures for each zone in the reflow oven and the process profile for the processor temperature (serving as an algebraic simulation for each corresponding setpoint) may be described as functions of the relative zone lengths (e.g., fractions of the total distance of the reflow oven) or other independent variable associated with distance. These boundary condition temperatures are expected to have reached steady-state prior to the thermal process and hence not vary with time. By contrast, if a part temperature is measured, the thermal data may be recorded with respect to time, during the period that the part is conveyed through the reflow oven.

A prediction algorithm for correcting setpoint temperature (for achieving a target temperature profile for the part) may require a correlation between the processor temperature that varies in space, and a part temperature that varies in time. Such a correlation may depend on accurate measurements for distance between zones within the reflow oven, conveyor speed, clock cycle time, and synchronization references, such as an event time for a part to enter or exit the reflow oven. Such information may be subject to measurement uncertainty, leading to errors in adjusting part temperature response. Hence, a method to obviate such information is desired.

SUMMARY OF THE INVENTION

A method for aligning a boundary condition temperature in a thermal processor utilizes an air temperature measurement. During the thermal process, air temperature measured along an interval series forms an air profile and provides a reference to which the boundary condition temperature may be aligned. A method for aligning a part temperature profile to the processor temperature profile uses the measured air temperature to adjust the part temperature profile, so as to be synchronized with the air temperature profile. These procedures may be used in conjunction with setpoint parameter prediction for attaining a target part temperature response.

BRIEF DESCRIPTION OF THE FIGURES

FIG. 1C is an isometric perspective diagram of a reflow oven used for thermal processing according to a specific embodiment of the present invention.

DETAILED DESCRIPTION OF THE PREFERRED EMBODIMENTS

Figure 1A:
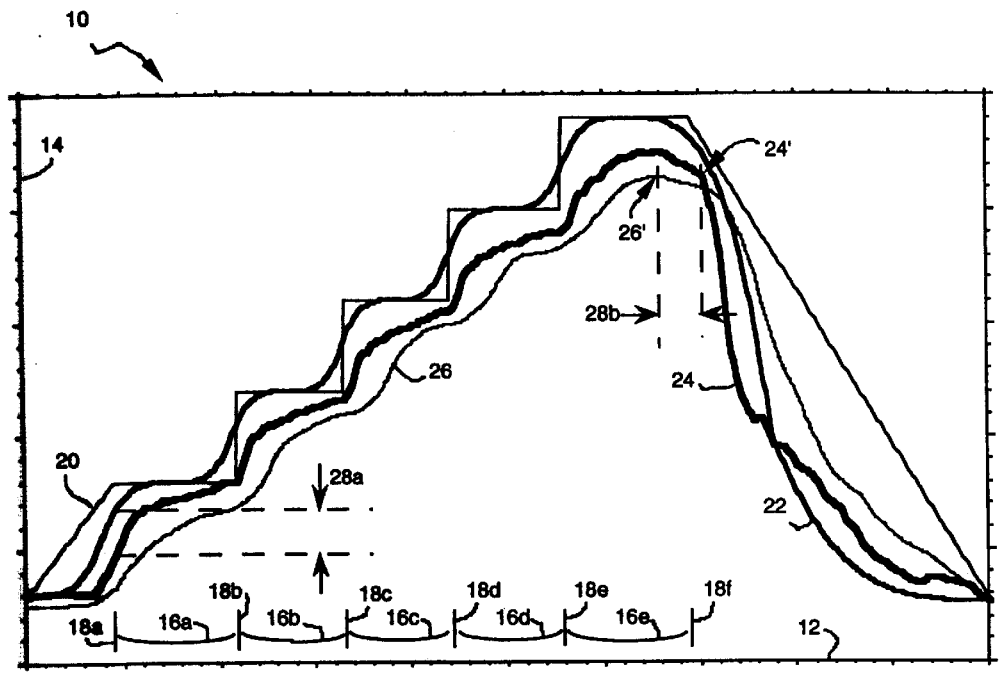
FIG. 1A is a plot diagram of temperature profiles against sample points according to a presently preferred embodiment of the present invention.

Those of ordinary skill in the art will realize that the following description of the present invention is illustrative only and not in any way limiting. Other embodiments of the invention will readily suggest themselves to such skilled persons after a perusal of this disclosure.

A part placed in a reflow oven may exhibit a temperature response profile for part temperature $T_p$. This response profile may be characterized with respect to time t from oven entry or other characteristic event that signals the beginning of the thermal process. The reflow oven may have a series of zones that may be individually controlled using heating or cooling elements targeted to an established control or setpoint temperature $T_c$. The setpoint profile may form a temperature distribution based on distance x from the oven entrance rather than time t, since the reflow oven's boundary conditions for a thermal process may be characterized as steady-state.

The boundary conditions may serve as the heat transfer driver for the part as the latter moves through the reflow oven. Conveyor speed u=dx/dt (in differential form), plus an initial condition, may provide the correspondence between distance and time. Comparison of the part's response profile to the reflow oven's boundary conditions thus may depend on information between the distances x and corresponding times t throughout the thermal process in the reflow oven.

Due to temperature diffusion across zone boundaries and heat capacity of oven components, the thermal environment to which the part responds may quantitatively differ from the setpoint condition. In addition, the heat capacity of the part attenuates its response to these conditions. Thus, the prediction of a part's response profile for a given the setpoint profile may entail convoluted analytical procedures.

The boundary conditions may be represented by either setpoint or processor temperatures. The former may indicate the control temperature for the heating and/or cooling elements. The latter may describe the temperature distribution within the oven. A process profile of processor temperature $T_z$ based on a smoothed interpolation of the setpoint temperatures $T_c$ may be generated by a computer program.

A setpoint temperature $T_c$ may be assumed as constant across its associated zone, and thus exhibit a step-function pattern in which the first or second derivative of the setpoint profile (with respect to distance) may be discontinuous between zone boundaries. To facilitate computation of temperature comparisons throughout the thermal process, a process profile may require continuity in the first and/or second derivatives, including at the zone boundaries. Accurate simulation of the reflow oven conditions may require that the processor temperature $T_z$ equal the setpoint temperature $T_c$, or the process profile have a flat slope (first derivative being zero) at a zone midpoint.

The process profile for simulating a smoothed form of the setpoint profile may be represented by a variety of mathematical forms, including a spline or a polynomial function. This interpolation of the process profile may be reversible— i.e., with an appropriate transformation algorithm between the setpoint and processor temperatures, one profile may be obtained from the other through correlation. Transformation may require the location of each zone boundary and may be highly sensitive to inaccuracies. Significant errors may result from the measurement of physical lengths within a reflow oven, increasing the difficulty of the prediction process to converge on a physically attainable setpoint profile solution, given the operational constraints of the reflow oven.

During the thermal process, a part may be placed on the conveyor and be subjected to temperature conditions represented by the process profile while moving through the reflow oven. A temperature sensor (such as a thermocouple) may be placed in proximity to the part in order to measure air temperature $T_a$ of the ambient zone atmosphere imparting convective heat transfer to the part. A second such sensor may be placed in physical contact with the part to measure a part temperature $T_p$.

The air temperature sensor may preferably be positioned above the conveyor at about parallel to the top surface of the part (or where a part might be located if a part were to be tested). The sensor may also preferably be positioned upstream of the leading edge of the part by a distance between a tenth of an inch and three inches to minimize heat-sink effects of the part on the air temperature measurement. Most preferably, the distance between the sensor and the part's leading edge may be about one inch.

The air profile based on a measured air temperature $T_a$ may be used to align the process profile for the processor temperature $T_z$, derived from setpoint temperature $T_c$. The air profile may also be used to synchronize the response profile for the part temperature $T_p$ with the process profile. The air profile may be represented along the nondimensional intervals called sample points j rather than distance along the conveyor in the reflow oven x, or time elapse t from beginning of the thermal process. For the purposes of this disclosure, temperature profiles are discussed with respect to sample points j.

The respective behavior of temperature profiles may be seen in FIG. 1A, which features a temperature graph 10 for an example five-zone reflow oven. The abscissa 12 represents the sample points j such that j=1, . . . , N (where N is the normalized number of sample points), while the ordinate 14 denotes the temperature scale (in degrees Celsius). The sample points j may be correlated to relative locations within the reflow oven or relative times for the part, assuming the sampling rate is held constant with respect to the conveyor speed u. In the example provided, the number of sample points may be normalized to N=500. The thermal process may be divided into five zones labeled 16a, 16b, 16c, 16d and 16e, as shown in this example. The boundary locations marking the beginning and end of each zone may be identified as 18a, 18b, 18c, 18d, 18e and 18f.

The setpoint profile 20 for setpoint temperature $T_c$ may be represented by a series of thin straight segments. The zones may be marked at the boundaries by step-function changes in setpoint temperature $T_c$. The process profile 22 for processor temperature $T_z$ may be represented by a thick line. The process profile 22 may exhibit an inflection at each zone boundary. The air profile 24 for air temperature $T_a$ may be represented by a very thick line predominantly below the process profile 22. At least one of the sample points j along the plotted air profile may correspond to a zone boundary between 18a and 18f. The response profile for the part temperature $T_p$ may be represented by a thin line 26 that may appear to lag the air profile 24.

As the temperature sensor for the air profile 24 increases or decreases in response to the reflow oven conditions, the air profile 24 may cross a trigger temperature value representing a particular condition for the thermal process. These triggers may include the thermal process start and stop of a temperature profile. The air profile 24 may be plotted against the sample point abscissa 12, and may remain thereafter fixed. The air profile 24 may include temperature measurements before, during and after the thermal process.

The setpoint and process profiles 20 and 22 may be aligned with the air profile 24 (within the thermal process) by a linear correlation. The alignment may include establishing a common interval, such as the start boundary 18a of the first zone, to which the setpoint and process profiles 20 and 22 may be shifted to minimize the temperature difference 28a with the air profile 24. The temperature difference 28a may be characterized by a constant bias term or offset ΔT. Shifting may be accomplished by adding a constant to the intervals associated with a profile.

The setpoint and process profiles 20 and 22 may be distorted (by expansion or contraction) for conforming their respective indications of zone lengths 16a through 16e to the profile inflections in the air profile 24. A profile may be distorted by multiplying a factor to these intervals. The multiplication factor may be constant throughout the profile, or vary along the oven length, depending on the relative zone widths and temperature variation across zone boundaries. A local multiplication factor may be constrained in value to avoid distorting a profile beyond the prediction algorithm's ability to obtain a physically obtainable solution.

The offset $\Delta T$ may be determined as the minimum difference between an oven temperature boundary condition and the air temperature $T_a$ for some characteristic thermal process position within the oven. In one embodiment, the setpoint temperature $T_c$ subtracts the peak value in air temperature $T_a$ for a preselected zone. (Any such preselected zone would correspond to a sample point j after the thermal process has started, which may correspond to $T_a$ having risen above a starting trigger value.) Alternatively, the offset $\Delta T$ may be the minimum difference between the processor temperature $T_z$ and air temperature $T_a$ corresponding to a common event, such as the start of the first zone.

By shifting and distorting the setpoint and process profiles 20 and 22 along the abscissa 12 for the minimum $\Delta T$, an alignment between the boundary condition and the air temperature measurement may be achieved. The aligned profiles may exclude boundary condition information before and after the thermal process, however. To remedy this deficiency, extrapolation of the setpoint profile may use linear interpolation between an ambient temperature and a thermal process boundary temperature. The process profile 22 may curvefit between these temperature values with a polynomial function.

The part temperature $T_p$ may also be measured in conjunction with the air temperature $T_a$. Correlation between a part's response profile 26 and the air profile 24 may be complicated by the part's heat capacity (average specific heat multiplied by the part mass). This heat capacity may attenuate the peak and delay the response profile relative to its heat transfer driver.

In order to synchronize the response profile 26 to the air profile 24, the peak air temperature $T_{a,max}$ within the air profile may be determined along with its corresponding sample point $j_{a,max}$. The peak part temperature $T_{p,max}$ at 26' within the response profile 26 may be determined along with its corresponding sample point $j_{p,max}$. The air profile 24 may be searched downstream (along the abscissa 12 to the right) of the peak air temperature $T_{a,max}$ until the air temperature has decreased to the level at 24' of the peak part temperature $T_{p,max}$ at 26' with its corresponding cross-over sample point $j_{p=a}$. The part's response profile 26 may be synchronized to the air profile 24 by shifting the response profile 26 along the abscissa 12 until the peak part temperature $T_{p,max}$ corresponds to the cross-over sample point $j_{p=a}$. (The response profile 26 is shown in FIG. 1A prior to being shifted.) A shift may be performed by adding a constant to the intervals associated with a profile. This shift may be shown as sample point difference 28b without distorting the response profile 26.

A reflow oven as shown in FIG. 1C may be subdivided into several zones of nonuniform length. A multi-zone conveyorized reflow oven 21 in isometric view with a cutaway portion 23 includes zones 16a, 16b, 16c, 16d and 16e for convenience, but multi-zone reflow ovens as intended for this invention may exhibit a variety of configurations with more or fewer temperature conditioning zones than illustrated. Techniques for predicting the part's temperature response profile 26 may depend on relative distances that the part 25 has traversed within the oven 21. While the ratio of a zone's length to the total oven length may be obtained from direct distance measurements, the errors associated with such measurement may be avoided by the present invention using the air profile 24.

A cutaway region 23 in the oven 21. shows an instrument probe 27 extending the entire or a segment of the oven length. The instrument probe 27, serving as a sensor arrangement, may include a series of thermocouples 24" for monitoring temperatures inside a zone. The temperature measurements from the thermocouple series 24" may produce the air temperature profile 24 as a function of intervals along the oven length.

The part 25 may ingress the oven 21 through entrance 18a and egress through exit 18f (in the direction shown by the broken-line arrow) by means a rail conveyor 29, well known in the art. The part 25 may include a thermocouple 26" or other measuring instrument for evaluating the thermal process for producing the response temperature profile 26 as a function of elapsed time through the oven 21. The oven 21 and complimentary items are illustrative only and not limiting in any manner with respect to the invention.

A reflow oven may be subdivided into multiple zones of nonuniform length. Techniques for predicting the part's temperature response profile may depend on relative distances that the part has traversed within a reflow oven.

While the ratio of a zone's length to the total oven length may be obtained from direct distance measurements, the errors associated with such measurement may be avoided by the present invention using the air profile.

Identification of the transition boundary locations between zones may be aided by the second derivative of air temperature with respect to sample points (reflecting the measurement's location in the reflow oven). The second derivative may be expressed by the operation $d^2T_a/dj^2$. The second derivative profile exhibits conditions that may identify physical characteristics used to locate zone boundaries. A setpoint profile designed to exploit the second derivative's behavior may establish a thermal process in which to measure air temperature and thereby locate the zones.

Figure 1B:
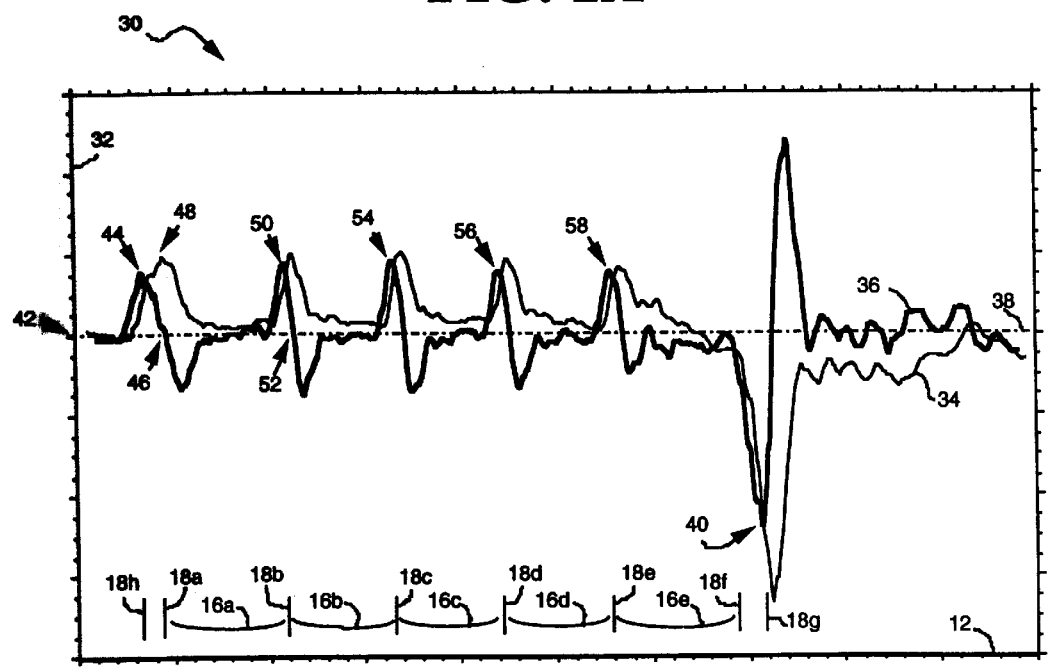
FIG. 1B is a plot diagram of derivative profiles against sample points according to a specific embodiment of the present invention.

FIG. 1B illustrates a difference graph 30 with the discretized derivative (in units of degrees Celsius) as the ordinate 32 plotted against sample points j as the abscissa 12. Superimposed above the abscissa 12 may be seen the zone locations 16a through 16e and their boundaries 18a through 18f. The first derivative profile 34 for the air temperature, shown by a thin solid line, may indicate positive values of $dT_a/dj$ (which may be expressed as $T_a'$) during the heating phase (until the end of the last zone at 18f). These $T_a'$ values may turn negative as the air temperature $T_a$ decreases with the processor temperature $T_z$.

The second derivative profile 36 for the air temperature, shown as a thick solid line, may resemble a sawtooth pattern. The second derivative for air temperature may be expressed $d^2T_a/dj^2$ (or $T_a''$). Both derivative profiles 34 and 36 may be contrasted with a zero-value axis 38 (shown in dot-dash), indicating whether a derivative at a particular sample point j may be positive or negative (by being above or below the axis 38). The identification of positive and negative peaks for profiles 34 and 36 may be restricted to absolute values exceeding a particular threshold, such as plus or minus one-third of a typical peak.

The profile 36 of the second derivative may have positive and negative peaks where $T_a''$ values reach their local absolute maximums that mark the inflections of the air profile 24 that in turn resembles the process profile 22. Selected inflections may coincide with the zone boundary locations 18a through 18f. The last and largest negative peak 40 may mark a position 18g near the last zone's boundary 18f, signaling the end of the thermal process. The sample point corresponding to the boundary 18g may be labeled n (assuming 1<n<N). With the number of zones M, known by the operator of the thermal processor, the beginning zone boundaries 18a through 18e may be at least approximately located for determining the fraction of total reflow oven length each zone represents. (This information may be sufficient for the purposes of adjusting setpoint parameters.) In this example, a five-zone oven may be used numbering from k=1, . . . , M, such that M=5. There may be M positive local peaks in the second derivative profile 36 before the last negative peak 40.

In a computer code designed to automate the zone boundary search, a single-dimensioned Boolean array g may be employed to identify which sample points j correspond to a zone boundary. This feature may be applicable when setpoint temperature difference across adjacent zones exceeds about 20° C. The elements g(j) or $g_j$ for j=1, . . . , n may be contained in array g such that $g_j \in g$. Each element g(j) may each have either a TRUE or FALSE value (although initially these elements may all be set to FALSE).

Beginning with the first sample point j=1 at the start of the thermal process at 42 and progressing along higher sample point values (in the right direction along the abscissa 12), the second derivative profile 38 may be searched to find a first positive peak $T_a$" value 44. The sample point corresponding to the first peak value 44 may be denoted as j(k=1) or $j_1$. The value of element $g(j_1)$ may be set to TRUE, and may correspond to an estimated start boundary 18h in proximity to of the boundary 18a for beginning zone 16a. The profile 38 may be searched (continuing with increasing sample points) for a value that reaches or drops below the zero-axis 38. A value corresponding to $T_a$"<0 may be denoted by the first zero-axis intercept 46. On the first derivative profile 34, this condition may correspond to a first peak 48. All values of $T_a$" in the profile 38 proceeding backwards (left along the abscissa 12) from the zero-axis intercept 46 to the start of the thermal process 42 may be set to zero. Peak identifying may use unsharp masking to edge detect within a noisy profile.

Repeating the search process with increasing sample points, a second positive peak $T_a$" value 50 may be discovered. The sample point corresponding to the second positive peak value 50 may be denoted as j(k=2) or $j_2$, and the value of the corresponding element $g(j_2)$ may be set to TRUE. The sample point value $j_2$ may correspond to the start boundary 18b of the second zone 16b. Proceeding until the next zero-axis intercept 52, all values of profile 38 between the intercept 52 and the start 42 may be set to zero.

This procedure may be repeated for identifiying the sample points at the remaining zone boundaries $j_3$, . . . , $j_{M-1}$, $j_M$ corresponding to k=3, . . . , M-1, M until all M zone start boundaries 18c through 18e are located. The positive peaks for this example are identified as 54, 56 and 58 marking the start of third, fourth and fifth zones 16c through 16e, respectively. In the array g, the elements at corresponding $g(j_3)$, . . . , $g(j_{M-1})$, $g(j_M)$ may be set to TRUE.

Figure 2:
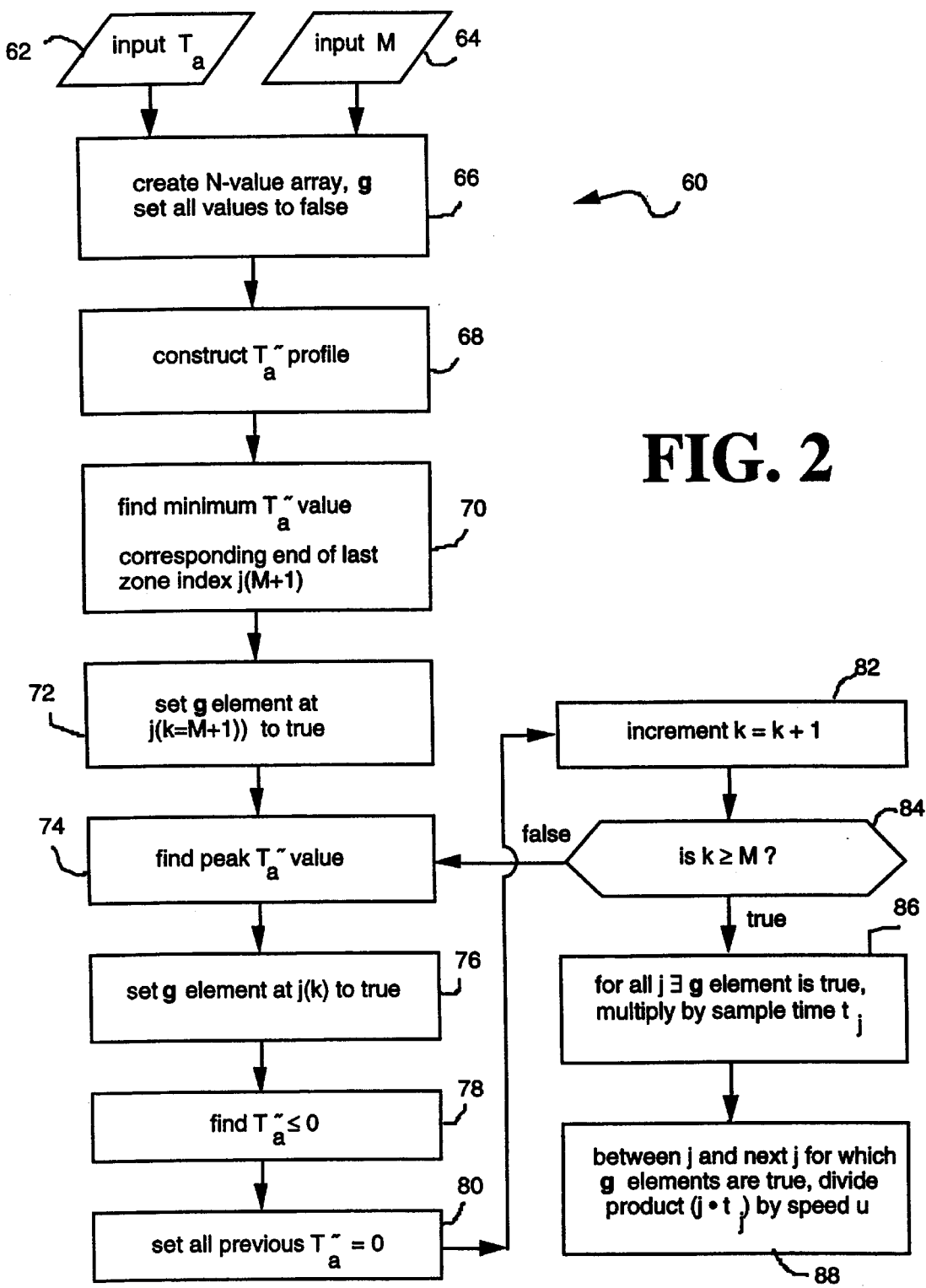
FIG. 2 is a flowchart diagram of the logic employed based on an air temperature according to a specific embodiment of the present invention.

In a reflow oven in which the distances between zone boundaries may not be established by physical measurement, the $T_a$" profile 36 may identify the zone boundary locations 18a through 18e to facilitate thermal profile prediction. The search for boundary locations may begin at the end of the thermal process. In FIG. 2, a flowchart 60 describes the procedure as illustrated graphically above. The procedure may begin with the input of measured air temperature data as 62, resampled to a selected number N. The number of zones M may be input as 64, meaning that M positive second derivative peaks may be searched.

A Boolean array of N-dimension may be created as 66, with each element defaulted to FALSE. A second derivative profile for $T_a$" values at respective sample points j may be constructed as 68 from the air temperature $T_a$ input data. The minimum second derivative value 40 in profile 36 may be found as 70, with the corresponding sample point labeled $j_{M+1}$ for an "end of the last zone" index. The corresponding Boolean element may be set to TRUE as 72.

The profile 36 may be searched as 74 from the sample point beginning 42 to locate a positive peak 44 in the second derivative $T_a$". The corresponding Boolean element for the positive peak may be set to TRUE as 76. The search along profile 36 may proceed as 78 until a zero or negative second derivative value 46 is located. The previous $T_a$" values in profile 36 may be set to zero as 80 between the beginning 42 and the zero-axis intercept 46. A counter k may increment by one the number of zones located as 82. This number of zone boundaries located may be compared to the number input M as 84. If these are not equal (the query at 84 being FALSE), the process may repeat the search starting at 74.

When the query at 84 may yield a TRUE result so that all M zone boundaries have been identified by their corresponding number of sample points j, the relative distances along the zones may be determined. For each sample point j in which the corresponding element in array g is TRUE, that number may be multiplied by the time $t_j$ between sample points as 86. The sample points j from the beginning 42 to each positive peak 44, 50, 54, 56 and 58 may yield a total of M+1 time-positions. The difference between one time-position and the next may be divided by the conveyor speed u to obtain the relative distance x across each zone as 88.

Figure 3:
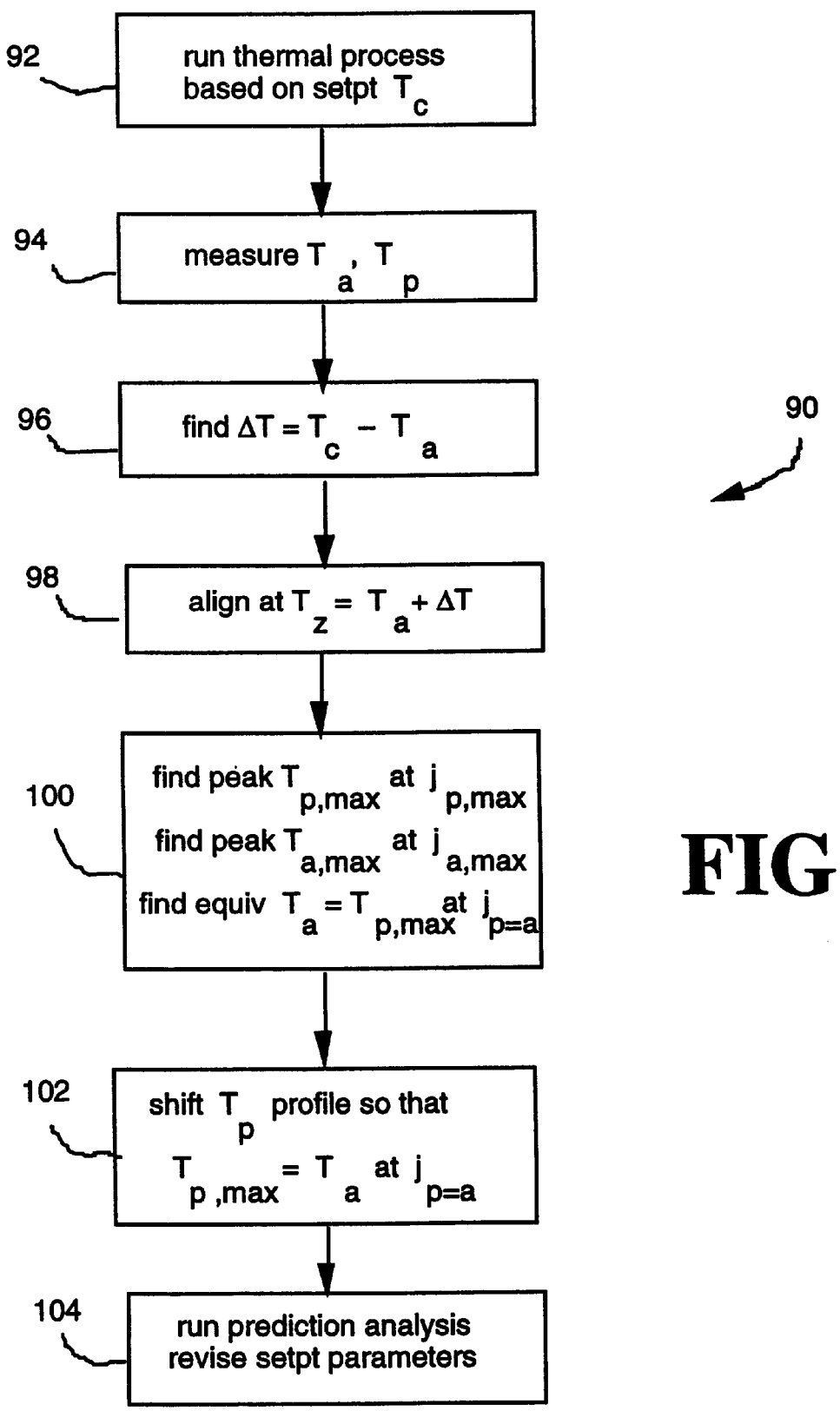
FIG. 3 is a flowchart diagram of the logic employed for correlating processor temperature and part temperature with air temperature according to a presently preferred embodiment of the present invention.

A more general form of the procedure for aligning processor temperature $T_z$ and synchronizing part temperature $T_p$ may be seen in FIG. 3 as a flowchart 90. The setpoint temperature $T_c$ for each zone and conveyor speed u may be established for executing a thermal process as 92 in a reflow oven. During the thermal process, temperature may be measured as 94 for air as $T_a$ and for a part as $T_p$. The resulting temperature measurements may be represented against a selected number of intervals called sample points ranging from j=1, . . . , N. From these temperature samples, an air profile 24 and a part response profile 26 may be produced. A temperature difference $\Delta T$ as 28a may be determined as 96 by subtracting the air temperature $T_a$ from the setpoint temperature $T_c$ for a minimum $\Delta T$ value at a selected interval. The setpoint and process profiles 20 and 22 may be shifted and/or distorted along the intervals until the temperature difference 28a with the air profile 24 has been minimized, achieving alignment as 98.

In order to synchronize the part's response profile to the prediction and air profiles 22 and 24, a series of operations as 100 may be performed. The peak part temperature $T_{p,max}$ corresponding to a sample point $j_{p,max}$ may be determined. The peak air temperature $T_{a,max}$ corresponding to sample point $j_{a,max}$ may be determined, followed by the air temperature equal to the peak part temperature at $j_{p=a}$. The part's response profile 26 with respect to sample points j may be shifted as 102 until the peak part temperature $T_{p,max}$ corresponds to the sample point $j_{p=a}$ at which the air profile 24 should cross the shifted response profile. With this information, a prediction analysis to revise setpoint parameters may be performed as 104.

Figure 4:
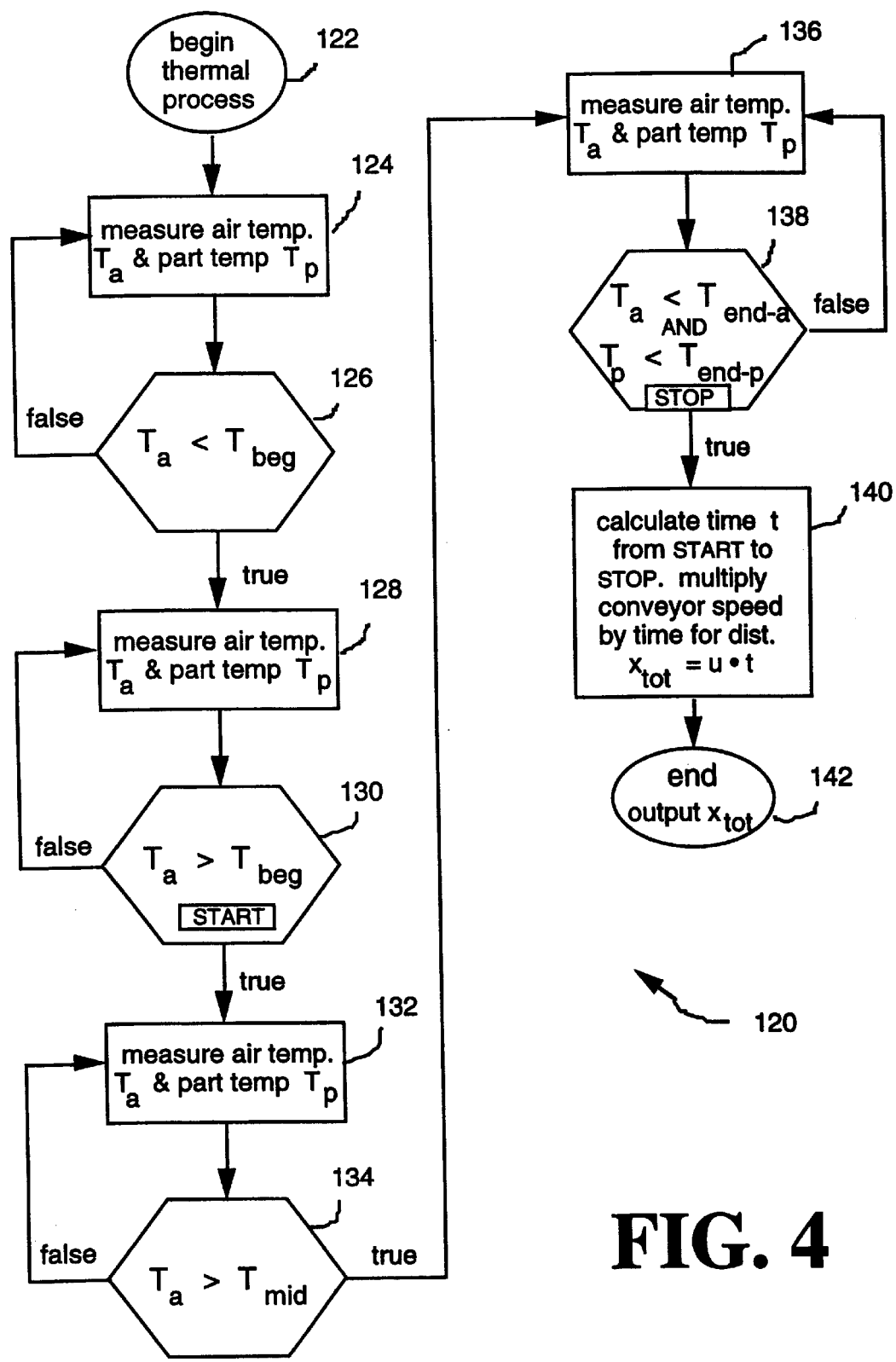
FIG. 4 is a flowchart diagram of the logic employed based on temperature measurement for identifying thermal process conditions according to a specific embodiment of the present invention.

The measurement of air temperature $T_a$, together with the temperature of the part $T_p$ may be used in the thermal process of a reflow oven to establish or adjust the conveyor speed u. A flowchart 120 describing this procedure may be seen in FIG. 4. With the initiation of the thermal process as 122, the air and part temperatures may be measured as 124 along the conveyor at a selected sample rate. An initiation query as 126 may determine whether $T_a$ is sufficiently cool to properly register a temperature increase from subsequent exposure in the reflow oven. If not, the measurement sampling may continue as 124 until the initiation query as 126 has been satisfied.

Upon proceeding, the air and part temperatures may be measured as 128, subject to a time-start query as 130 as to whether $T_a$ has elevated above the beginning threshold temperature indicating that the temperature sensors have entered into the reflow oven and registering the start for thermal process time. If not, the measurement sampling may continue as 128. Upon satisfaction of the time-start query as 130, a start condition may be yielded with which to begin time-elapse t.

Upon proceeding, the air and part temperatures may be measured as 132, subject to a query as 134 as to whether $T_a$ has elevated above some midpoint threshold temperature. Satisfaction of this condition may be needed to properly determine the end of the thermal process. If the midpoint condition has not been satisfied, the measurement sampling may continue as 132. After satisfaction of the query as 134, the process may proceed to measure air and part temperatures as 136.

From these measurements, dual-condition query as 138 may be posed to determine if the temperature sensors have exited the reflow oven. The dual-condition query as 138 may determine whether $T_a$ has cooled to a value below an air-end threshold together with whether $T_p$ has cooled to a value below a part-end threshold. If both conditions are not satisfied, the measurement sampling may continue as 136. Upon satisfaction of both conditions, the time-elapse t may be stopped as 140 for the end of the thermal process. The time-elapse t may be multiplied by conveyor speed u to determine the total length $x_{tot}$ for output as 142.

While embodiments and applications of the invention have been shown and described, it would be apparent to those of ordinary skill in the art, after a perusal of this disclosure, that many more modifications than mentioned above are possible without departing from the inventive concepts herein. The invention, therefore, is not to be restricted except in the spirit of the appended claims.

What is claimed is:

1. A method for aligning a boundary condition temperature to a zone boundary in a multi-zone conveyorized thermal processor, said method comprising:
   running a thermal process with a setpoint temperature in a zone and a conveyor speed for a conveyor;
   measuring an air temperature in the thermal processor along a series of intervals, wherein an interval within said series of intervals corresponds to the zone boundary;
   determining an offset for a minimum difference between the boundary condition temperature and said air temperature; and
   shifting and distorting the boundary condition temperature along said series of intervals until said air temperature differs from the boundary condition temperature by said offset.

2. A method according to claim 1 wherein the boundary condition temperature corresponds to a profile of said setpoint temperature.

3. A method according to claim 1 wherein the boundary condition temperature corresponds to a smoothed profile of said setpoint temperature, wherein said smoothed profile interpolates a processor temperature.

4. A method according to claim 1 wherein said finding a minimum subtracted difference further includes requiring said air temperature to be above a start trigger value.

5. A method according to claim 1 further including:
   comparing said air temperature to a trigger value for monitoring a process condition.

6. A method according to claim 5 wherein said process condition is a start indicator.

7. A method according to claim 5 wherein said process condition is a midpoint indicator.

8. A method according to claim 5 wherein said process condition is a stop indicator.

9. A method according to claim 1 wherein said shifting and distorting the boundary condition temperature further includes adding a first constant and multiplying a second constant to said series of intervals.

10. A method for synchronizing a part temperature to a zone boundary in a multi-zone conveyorized thermal processor, said method comprising:
    running a thermal process with a setpoint temperature in a zone and a conveyor speed for a conveyor;
    measuring an air temperature in the thermal processor along a series of intervals, wherein an interval within said series of intervals corresponds to the zone boundary;
    measuring a part temperature in the thermal processor along said series of intervals;
    finding a peak part temperature along said series of intervals;
    finding an equivalent air temperature equal to said peak part temperature at a cross-over interval; and
    shifting said part temperature along said series of intervals until said peak part temperature corresponds to said cross-over interval.

11. A method according to claim 10 wherein said measuring an air temperature is performed by a sensor above said conveyor about parallel to a top surface of a test part.

12. A method according to claim 10 wherein said sensor is upstream of said test part by a distance of between one-tenth inch and three inches.

13. A method according to claim 10 wherein said sensor is upstream of said test part by a distance of about one inch.

14. A method according to claim 10 wherein said shifting said part temperature further includes adding a constant to said series of intervals.

15. A method for correlating a part temperature to a boundary condition temperature in a multi-zone conveyorized thermal processor, said method comprising:
    running a thermal process with a setpoint temperature in a zone and a conveyor speed for a conveyor;
    measuring an air temperature in the thermal processor along a series of intervals;
    measuring a part temperature in the thermal processor along said series of intervals;
    determining an offset for a minimum difference between the boundary condition temperature and said air temperature;
    shifting and distorting the boundary condition temperature along said series of intervals until said air temperature differs from the boundary condition temperature by said offset;
    finding a peak part temperature within said response profile;

finding an equivalent air temperature equal to said peak part temperature at a cross-over interval; and shifting said response profile along said abscissa until said peak part temperature corresponds to said cross-over interval.

16. A method according to claim 15 wherein the boundary condition temperature corresponds to a profile of said setpoint temperature.

17. A method according to claim 15 wherein the boundary condition temperature corresponds to a smoothed profile of said setpoint temperature, wherein said smoothed profile interpolates a processor temperature.

18. A method according to claim 15 wherein said shifting and distorting the boundary condition temperature further includes adding a first constant and multiplying a second constant to said series of intervals.

19. A method according to claim 15 wherein said shifting part temperature further includes adding a third constant to said series of intervals.

20. A method for locating zone locations in a conveyorized thermal processor having a plurality of zones, said method comprising:

running a thermal process with a setpoint temperature in a zone and a conveyor speed for a conveyor;

measuring an air temperature in the thermal processor along a series of intervals to produce an air profile;

calculating a second derivative profile from said air profile;

identifying an end of a last zone in the plurality of zones; and identifying a start of each zone in the plurality of zones.

21. A method according to claim 20 wherein a difference between a first setpoint temperature and a second setpoint temperature greater than or equal to an established minimum.

22. A method according to claim 20 wherein said identifying an end of the a last zone further includes:

creating a Boolean array having a plurality of elements, wherein each element corresponds to an air temperature measurement;

setting said each element in said Boolean array to a first logical value;

finding a maximum negative peak of said second derivative profile; and setting an element to a second logical value, wherein said element corresponds to said maximum negative peak.

23. A method according to claim 22 wherein said identifying a start of each zone further includes:

finding a positive peak of said second derivative profile; and setting an element to said second logical value, wherein said element corresponds to said maximum negative peak.

24. A method according to claim 23 wherein said identifying a start of each zone further includes:

determining a number of zones in the multi-zone conveyorized thermal processor; and repeating said finding a positive peak and said setting an element until a number of positive peaks corresponds to said number of zones.

25. A method according to claim 20 wherein said measuring an air temperature is performed by a sensor above said conveyor about parallel to a top surface of a test part.

26. A method according to claim 25 wherein said sensor is upstream of said test part by a distance of between one-tenth inch and three inches.

27. A method according to claim 25 wherein said sensor is upstream of said test part by a distance of about one inch.

* * * * *

UNITED STATES PATENT AND TRADEMARK OFFICE
CERTIFICATE OF CORRECTION

PATENT NO. : 6,283,379 B1
DATED : September 4, 2001
INVENTOR(S) : Kazmierowicz et al.

It is certified that error appears in the above-identified patent and that said Letters Patent is hereby corrected as shown below:

Column 3,
Line 14, after the word "given" delete "the".

Column 6,
Beginning at line 18, delete the following:
"A reflow oven may be subdivided into multiple zones of nonuniform length. Techniques for predicting the part's temperature response profile may depend on relative distances that the part has transversed with a reflow oven.
While the ratio of a zone's length to the total oven length may be obtained from direct distance measurements, the errors associated with such measurement may be avoided by the present invention using the air profile."

Column 7,
Line 28, after the word "to" delete "of".
Line 31, replace "<" with -- $\leq$ --.

Column 12,
Line 2, after the word "the" delete "a".

UNITED STATES PATENT AND TRADEMARK OFFICE
CERTIFICATE OF CORRECTION

| | |
|---|---|
| PATENT NO. | : 6,283,379 B1 |
| DATED | : September 4, 2001 |
| INVENTOR(S) | : Kazmierowicz et al. |

Page 2 of 2

It is certified that error appears in the above-identified patent and that said Letters Patent is hereby corrected as shown below:

Drawings,
Insert figure as shown below:

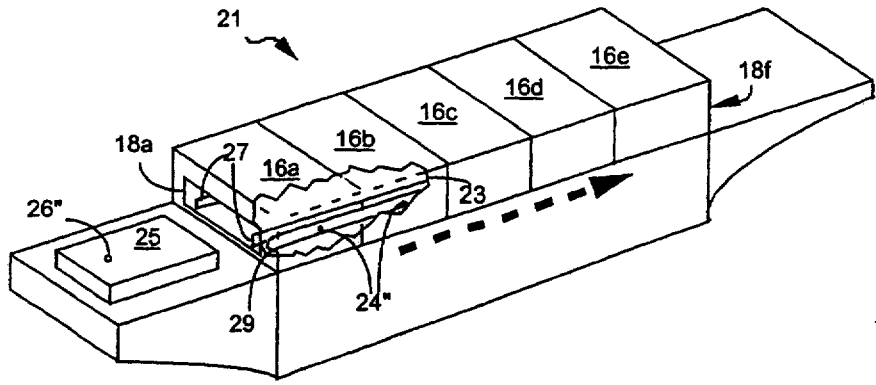

FIG. 1C

Signed and Sealed this

Twenty-third Day of April, 2002

Attest:

*Attesting Officer*

JAMES E. ROGAN
*Director of the United States Patent and Trademark Office*